(12) United States Patent
Pai et al.

(10) Patent No.: US 11,425,827 B2
(45) Date of Patent: Aug. 23, 2022

(54) FOLDABLE ELECTRONIC DEVICE

(71) Applicant: Acer Incorporated, New Taipei (TW)

(72) Inventors: Ting-Wen Pai, New Taipei (TW);
Chi-Hung Lai, New Taipei (TW);
Wu-Chen Lee, New Taipei (TW);
Chih-Chun Liu, New Taipei (TW)

(73) Assignee: Acer Incorporated, New Taipei (TW)

( * ) Notice: Subject to any disclaimer, the term of this patent is extended or adjusted under 35 U.S.C. 154(b) by 249 days.

(21) Appl. No.: 16/858,760

(22) Filed: Apr. 27, 2020

(65) Prior Publication Data

US 2021/0059059 A1 Feb. 25, 2021

(30) Foreign Application Priority Data

Aug. 23, 2019 (TW) .................................. 108211212

(51) Int. Cl.
| | |
|---|---|
| *H05K 5/00* | (2006.01) |
| *H05K 5/02* | (2006.01) |
| *E05D 7/00* | (2006.01) |
| *E05D 3/06* | (2006.01) |

(52) U.S. Cl.
CPC ............ *H05K 5/0017* (2013.01); *E05D 3/06* (2013.01); *E05D 7/009* (2013.01); *H05K 5/0226* (2013.01); *E05Y 2900/606* (2013.01)

(58) Field of Classification Search
CPC ...... H05K 5/0017; H05K 5/0226; E05D 3/06; E05D 7/009; E05Y 2900/606; G06F 1/1681; G06F 1/1618; G06F 1/1616
See application file for complete search history.

(56) References Cited

U.S. PATENT DOCUMENTS

| | | | | |
|---|---|---|---|---|
| 8,720,011 | B1* | 5/2014 | Hsu .......................... | E05D 3/122 |
| | | | | 16/354 |
| 9,606,583 | B2* | 3/2017 | Ahn ...................... | G06F 1/1681 |
| 9,625,947 | B2* | 4/2017 | Lee ....................... | G06F 1/1616 |
| 9,915,981 | B2* | 3/2018 | Hsu ....................... | G06F 1/1652 |
| 10,659,576 | B1* | 5/2020 | Hsu ...................... | H04M 1/0268 |
| 10,694,623 | B2* | 6/2020 | Park ........................ | G09F 9/301 |
| 10,765,023 | B2* | 9/2020 | Zhang ................... | G06F 1/1652 |
| 10,975,603 | B2* | 4/2021 | Tazbaz ................ | H04M 1/0268 |
| 2012/0044620 | A1* | 2/2012 | Song ................... | H04M 1/0216 |
| | | | | 361/679.01 |
| 2014/0126121 | A1* | 5/2014 | Griffin ................ | H04M 1/0216 |
| | | | | 361/679.01 |

(Continued)

*Primary Examiner* — Hung S. Bui
*Assistant Examiner* — Sagar Shrestha
(74) *Attorney, Agent, or Firm* — JCIPRNET

(57) ABSTRACT

A foldable electronic device including a first body, a second body, a flexible display disposed on the first and the second bodies, a hinge assembly connected between the first and the second bodies, an extension chain assembly, and a linkage is provided. The first and the second bodies are rotated relatively to be unfolded or folded via the hinge assembly. An end of the linkage and an end of the extension chain assembly are pivoted together and coupled to the first body in a sliding and pivoting manner. Another end of the linkage is pivoted to the hinge assembly, and another end of the extension chain assembly is pivoted to the second body. In a transforming process between the folded and the unfolded states, an extension traveling of the extension chain assembly compensates a size difference of the flexible display between the folded and the unfolded states.

7 Claims, 5 Drawing Sheets

(56) References Cited

U.S. PATENT DOCUMENTS

| | | | |
|---|---|---|---|
| 2017/0061836 A1* | 3/2017 | Kim | G06F 1/1641 |
| 2017/0303414 A1* | 10/2017 | Chu | H05K 5/0226 |
| 2018/0136696 A1* | 5/2018 | Chen | H04M 1/0216 |
| 2018/0192528 A1* | 7/2018 | Lin | G06F 1/1652 |
| 2018/0242466 A1* | 8/2018 | Lee | H05K 5/0217 |
| 2018/0275725 A1* | 9/2018 | Lin | G06F 1/1616 |
| 2019/0090364 A1* | 3/2019 | Shin | G09F 9/301 |
| 2019/0098783 A1* | 3/2019 | Zhang | E05D 11/0054 |
| 2019/0212786 A1* | 7/2019 | Lin | H04M 1/0216 |
| 2020/0326751 A1* | 10/2020 | Kim | G06F 1/1616 |
| 2021/0011513 A1* | 1/2021 | Watamura | G06F 1/1652 |

* cited by examiner

FOLDABLE ELECTRONIC DEVICE

CROSS-REFERENCE TO RELATED APPLICATION

This application claims the priority benefit of Taiwan application serial no. 108211212, filed on Aug. 23, 2019. The entirety of the above-mentioned patent application is hereby incorporated by reference herein and made a part of this specification.

BACKGROUND

Technical Field

The present disclosure relates to an electronic device, and more particularly, to a foldable electronic device.

Description of Related Art

Along with the constant enhancement of technology, a foldable electronic device adopting a flexible display has gradually become the development trend in the future, while on the component configuration of such kind of device, such as a smart phone, the flexible display is generally set on two bodies, so that when the two bodies are rotated relatively to be folded or unfolded via a hinge, the flexible display may be transformed between a bent and folded state and an unfolded and flattened state accordingly.

However, because the flexible display has size (for example, the arc length at the bend) changes at the inner side and the outer side of the bend when being bent, when mechanism design of the hinge is performed, the change needs to be listed for consideration, so as to prevent the flexible display from being damaged in the bending or unfolding and flattening process.

SUMMARY

The present disclosure provides a foldable electronic device, which is capable of providing a complying mechanism in the process of state transforming between a bent state and an unfolded and flattened state of a flexible display to compensate the length difference of the flexible display, so that the process and action are smooth and damage of the flexible display is avoided.

The foldable electronic device of the present disclosure includes a first body, a second body, a flexible display disposed on the first and the second bodies, a hinge assembly connected between the first and the second bodies, an extension chain assembly and a linkage. The first and the second bodies are rotated relatively to be unfolded or folded via the hinge assembly. An end of the linkage and an end of the extension chain assembly are pivoted together and coupled to the first body in a sliding and pivoting manner. Another end of the linkage is pivoted to the hinge assembly, and another end of the extension chain assembly is pivoted to the second body. In a transforming process between the folded state and the unfolded state, an extension traveling of the extension chain assembly compensates a size difference of the flexible display generated in the transforming process between the folded state and the unfolded state.

Based on the foregoing, the foldable electronic device is matched with the linkage disposed between the hinge assembly and the bodies via the extension chain assembly connected between the two bodies, so that in the transforming process between the folded state and the unfolded state of the two bodies, a pivoted portion of the linkage and the extension chain assembly is capable of sliding in one of the two bodies, so as to drive the extension chain assembly to generate an extension state change, while the extension traveling may be used for compensation of the size difference generated in the transforming process of the flexible display, and therefore, the arc shape presented by the flexible display in the folded state may be smoothly eliminated when the flexible display is transformed to the unfolded state, so that the flexible display presents a flattened linear outline in the unfolded state, and then the situation that the flexible display is wrinkled or broken is effectively avoided, to prolong the service life of the flexible display.

In order to make the aforementioned and other objectives and advantages of the present invention comprehensible, embodiments accompanied with figures are described in detail below.

DESCRIPTION OF THE EMBODIMENTS

Figure 1:
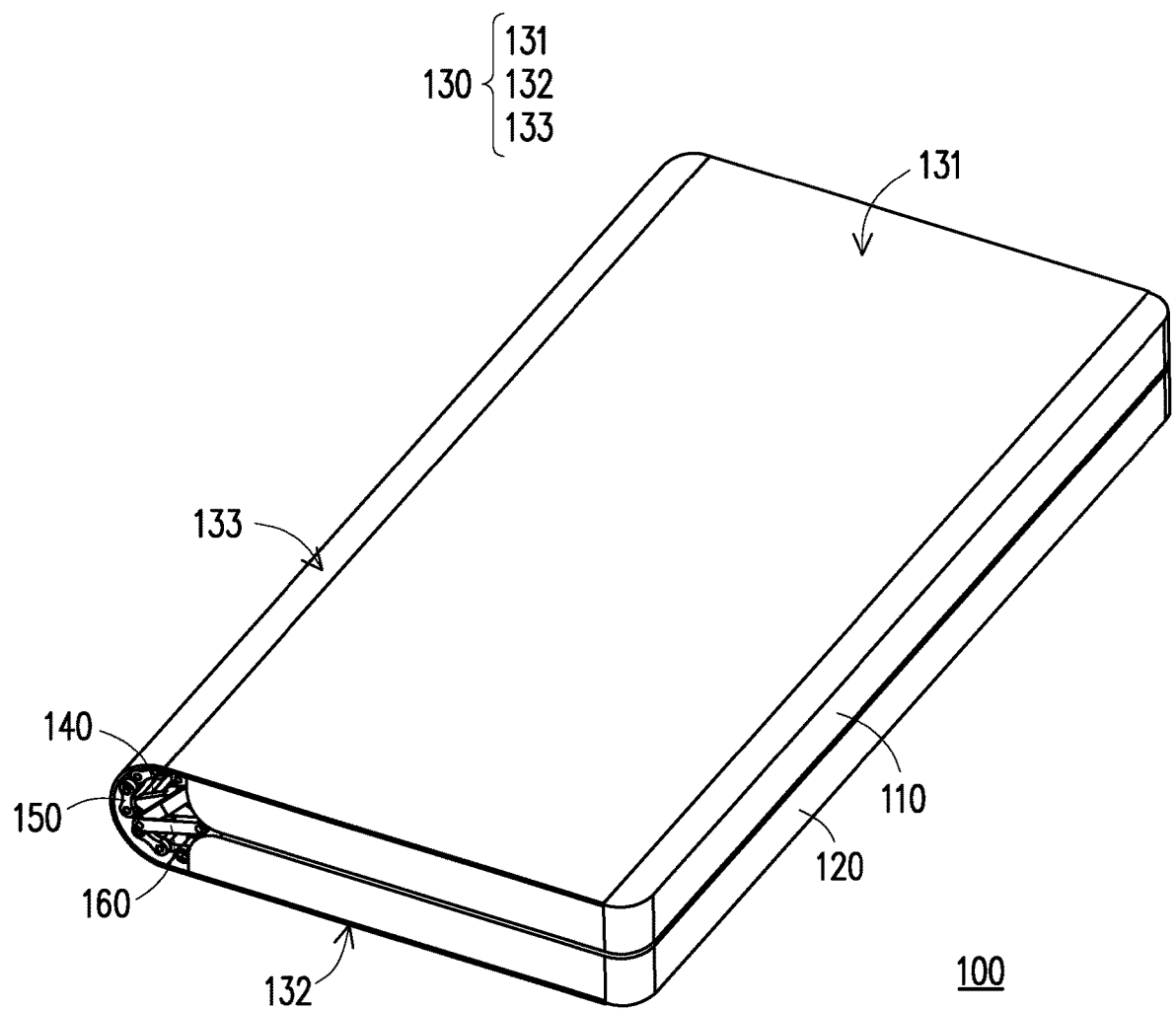
FIG. 1 is a schematic diagram of a foldable electronic device according to an embodiment of the present disclosure.
Figure 2:
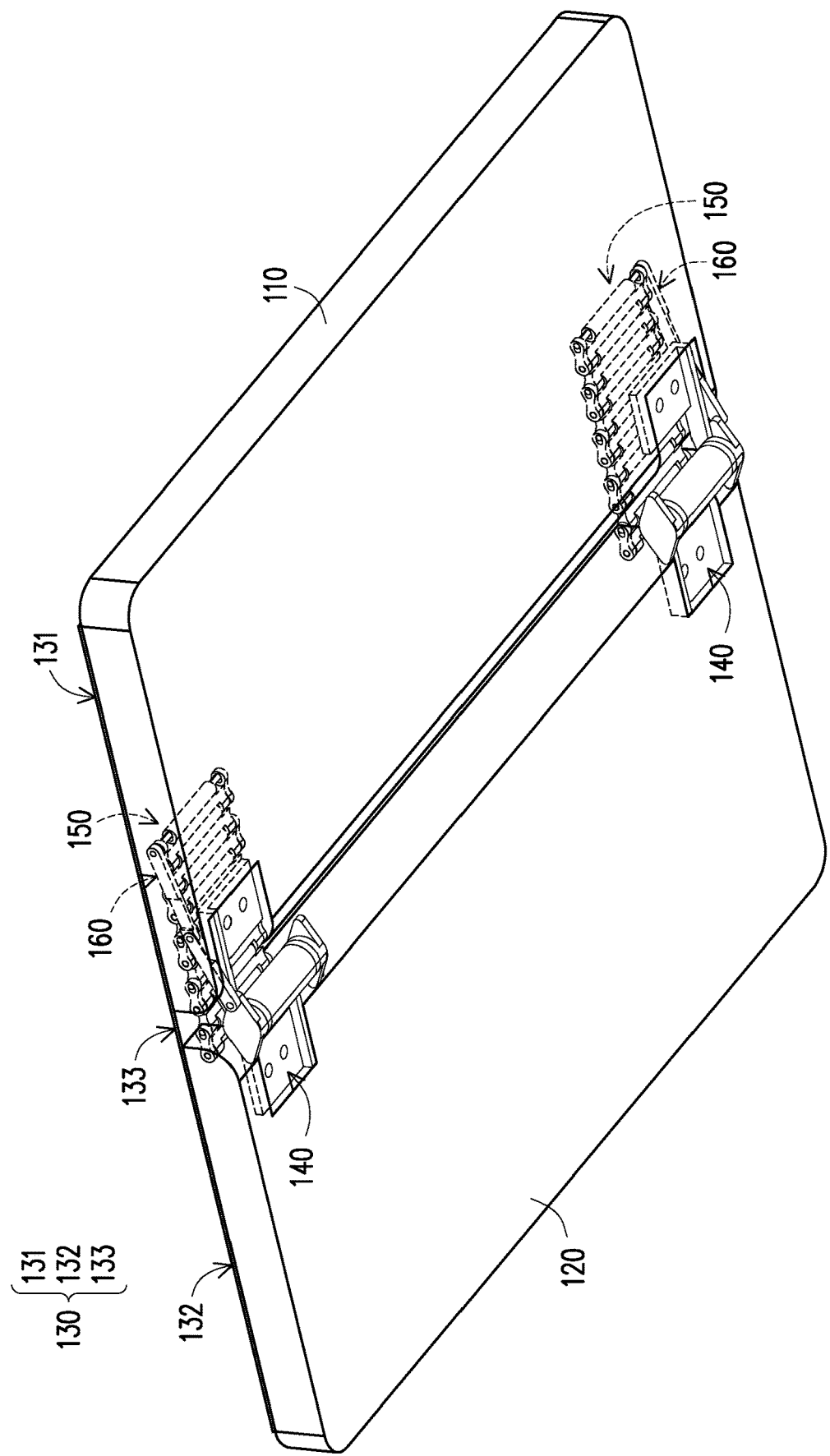
FIG. 2 is a schematic diagram of the foldable electronic device of FIG. 1 in another state.
Figure 3:
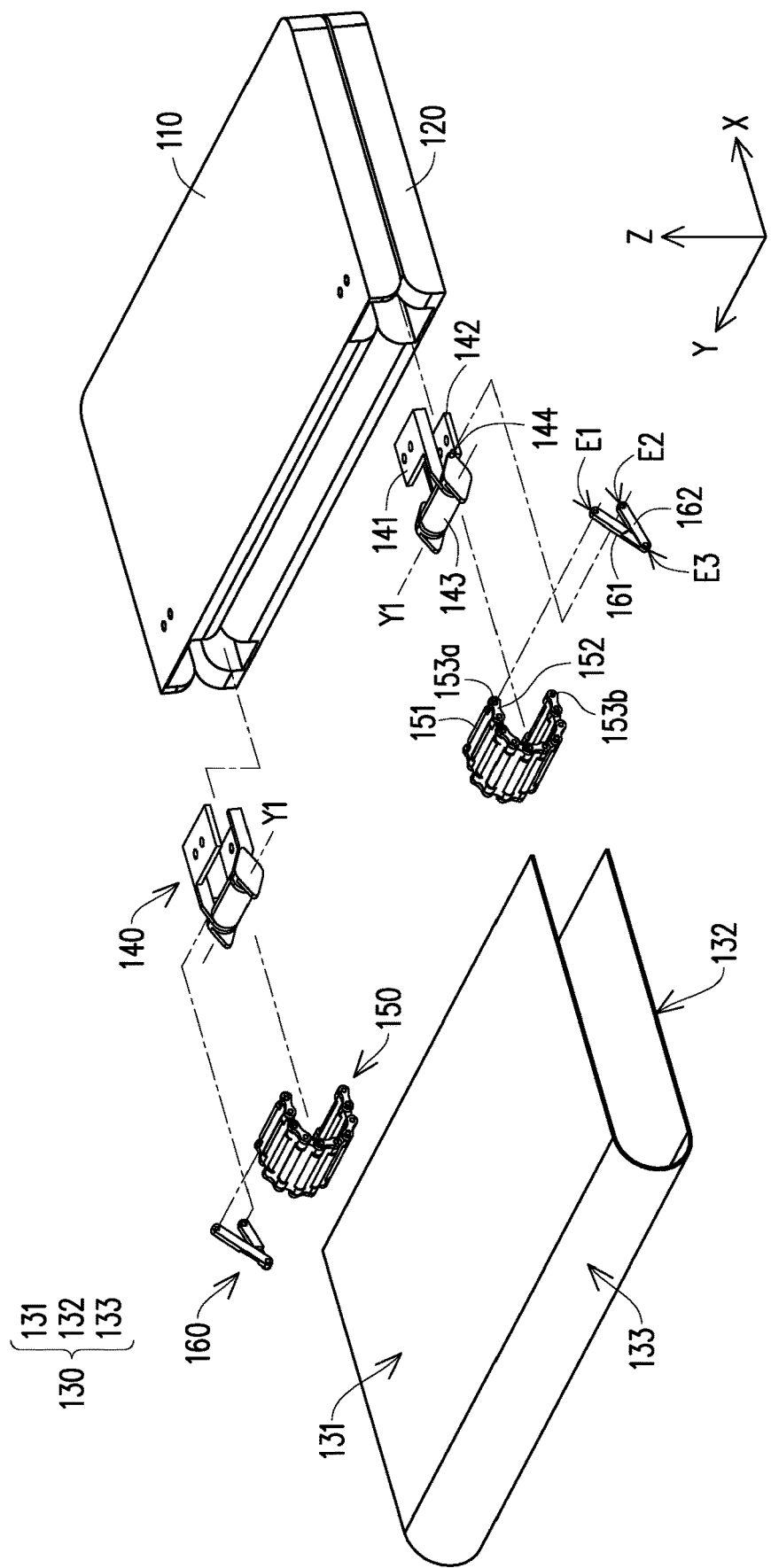
FIG. 3 is an exploded diagram of the foldable electronic device of FIG. 1.

FIG. 1 is a schematic diagram of a foldable electronic device according to an embodiment of the present disclosure. FIG. 2 is a schematic diagram of the foldable electronic device of FIG. 1 in another state. FIG. 3 is an exploded diagram of the foldable electronic device of FIG. 1. Meanwhile, a right-angle coordinate X-Y-Z is provided to be favorable for component description. Referring to FIG. 1 to FIG. 3, in the present embodiment, the foldable electronic device 100 includes a first body 110, a second body 120, a flexible display 130, a hinge assembly 140, an extension chain assembly 150 and a linkage 160. The flexible display 130 is disposed on the first body 110 and the second body 120. The hinge assembly 140 is connected between the first body 110 and the second body 120, the first body 110 and the second body 120 are rotated relatively with reference to Y axis to be unfolded or folded (FIG. 1 shows the folded state) via the hinge assembly 140. An end of the linkage 160 and an end of the extension chain assembly 150 are pivoted together and coupled to the first body 110 in a sliding and pivoting manner, and another end of the extension chain assembly 150 is pivoted to the second body 120, and another end of the linkage 160 is pivoted to the hinge assembly 140. In a transforming process between the folded state and the unfolded state, an extension traveling of the extension chain assembly 150 compensates a size difference of the flexible display 130 generated in the transforming process between the folded state and the unfolded state.

Figure 4:
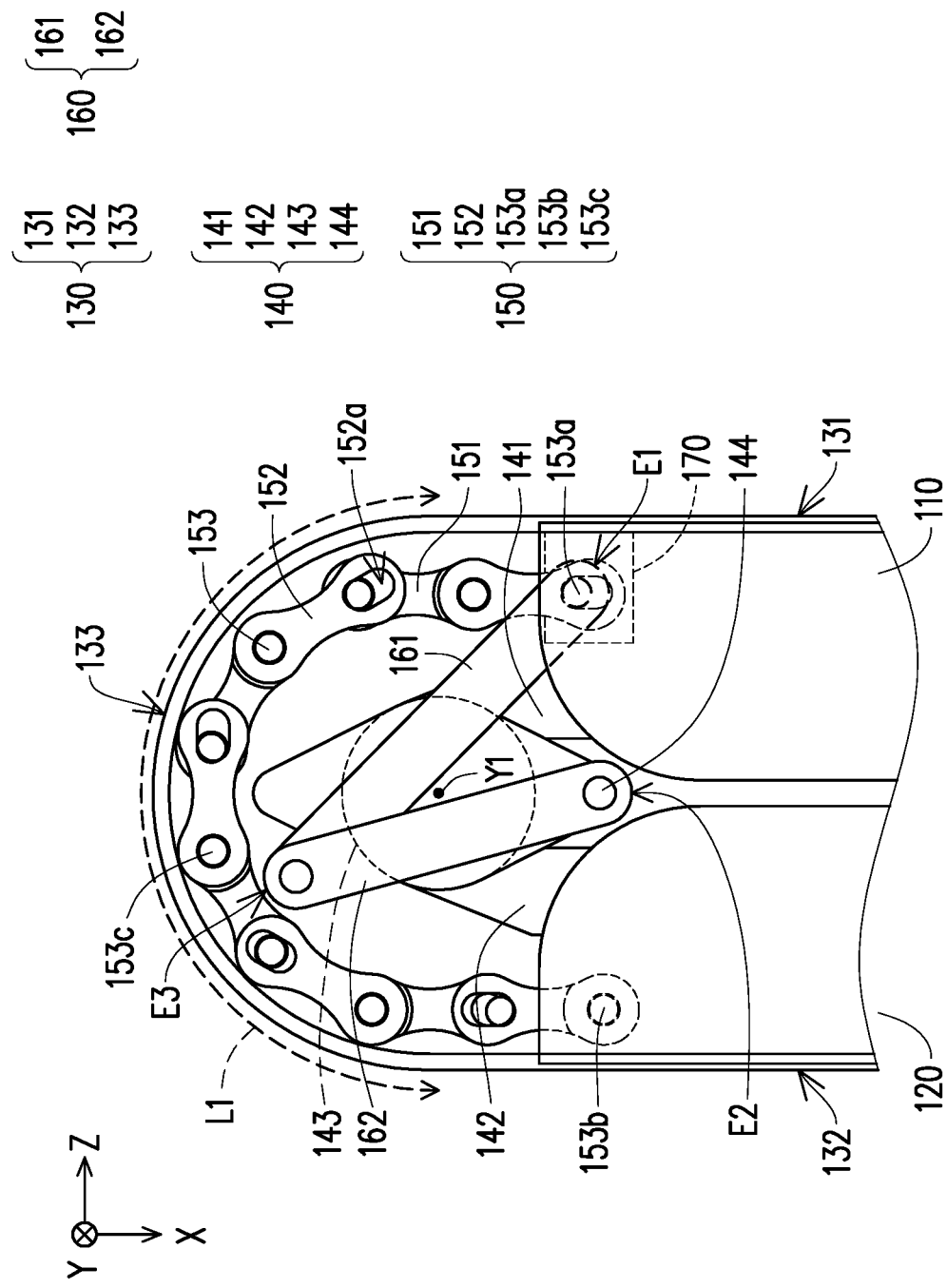
FIG. 4 is a partial enlarged diagram of the foldable electronic device of FIG. 1.

In details, FIG. 4 is a partial enlarged diagram of the foldable electronic device of FIG. 1. Referring to FIG. 3 and FIG. 4, the flexible display 130 of the present embodiment has a first portion 131, a second portion 132 and a third portion 133, the first portion 131 being disposed on the first body 110, the second portion 132 being disposed on the second body 120, the third portion 133 being connected between the first portion 131 and the second portion 132. In the folded state, the first body 110 is overlapped on the second body 120, and the third portion 133 is suspended between the first body 110 and the second body 120, and the third portion 133 leans against an arc-shaped local portion of the extension chain assembly 150.

Moreover, the hinge assembly 140, for example, is a gull wing type hinge, and includes a first bracket 141, a second bracket 142, a hinge 143 and an eccentric member 144, wherein the first bracket 141 is assembled on the first body 110, the second bracket 142 is assembled on the second body 120, the hinge 143 is pivoted on the first bracket 141 and the second bracket 142, and the hinge assembly 140 has a rotating shaft Y1 (parallel to the Y axis) so that the hinge assembly 140 is pivoted and rotated with reference to the Y axis. The eccentric member 144, for example, is a boss eccentric from the rotating shaft Y1, and the protruding axial direction is parallel to the Y axis.

Moreover, the extension chain assembly 150 includes a plurality of chains 151, a plurality of connecting members 152 and a plurality of shafts; it is marked herein that one end of the extension chain assembly 150 is provided with a shaft 153a, while the other end is provided with a shaft 153b, and only one of the rest shafts 153c is marked as a representative, wherein the shaft 153a is used for allowing the extension chain assembly 150 to be movably pivoted to the first body 110 besides being pivoted to the linkage 160. By contrast, the shaft 153b is pivoted to the second body 120 without generating relative movement with the second body 120, and the rest shafts 153c have different corresponding relations along with the difference of the structure of the connecting members 152. Further, the chains 151 and the shafts 153a-153c are arrayed between the first body 110 and the second body 120 along a line L1 (an arc with dotted-line double arrows is taken as an example in FIG. 3), and the shafts 153a-153c respectively penetrate through the chains 151 correspondingly, the connecting members 152 are located at two opposite sides of the chains 151 (as shown in FIG. 2), each connecting member 152 is pivoted to two adjacent shafts 153a-153c, each connecting member 152 has a counterbore 152a, and one of any two adjacent shafts 153a-153c is pivoted to the counterbore 152a. Meanwhile, the extension chain assembly 150 generates linking relation with the first portion 131 of the flexible display 130 by a bonding member 170, so that the flexible display 130 may be linked along with the extension or shortening of the extension chain assembly 150, so as to be favorable for compensating the size difference of the flexible display 130 between the folded state and the flattened state.

Moreover, the linkage 160 includes a first connecting rod 161 and a second connecting rod 162, wherein the first connecting rod 161 has a first end E1 pivoted with the extension chain assembly 150, the first end E1 is movably pivoted to the first body 110, the second connecting rod 162 is pivoted to a third end E3 with the first connecting rod 161, the second connecting rod 162 also has a second end E2 to be pivoted to the hinge assembly 140, and the second end E2 rotates relative to the rotating shaft Y1 of the hinge assembly 140.

Referring to FIG. 3 and FIG. 4 again, based on the foregoing component configuration, in the folded state, the extension chain assembly 150 presents an arc shape, and the rotating shaft Y1 of the hinge assembly 140 is located at the center of circle of the arc shape. The linkage 160 is pivoted to the hinge assembly 140, that is, the eccentric member 144 and the second end E2 of the second connecting rod 162 are eccentric from the rotating shaft Y1 of the hinge assembly 140, i.e., the second end E2 will keep a fixed distance from the rotating shaft Y1. Moreover, the hinge assembly 140 is a gull wing type hinge, and the rotating shaft Y1 of the hinge assembly 140 is located outside the first body 110 and the second body 120.

Figure 5:
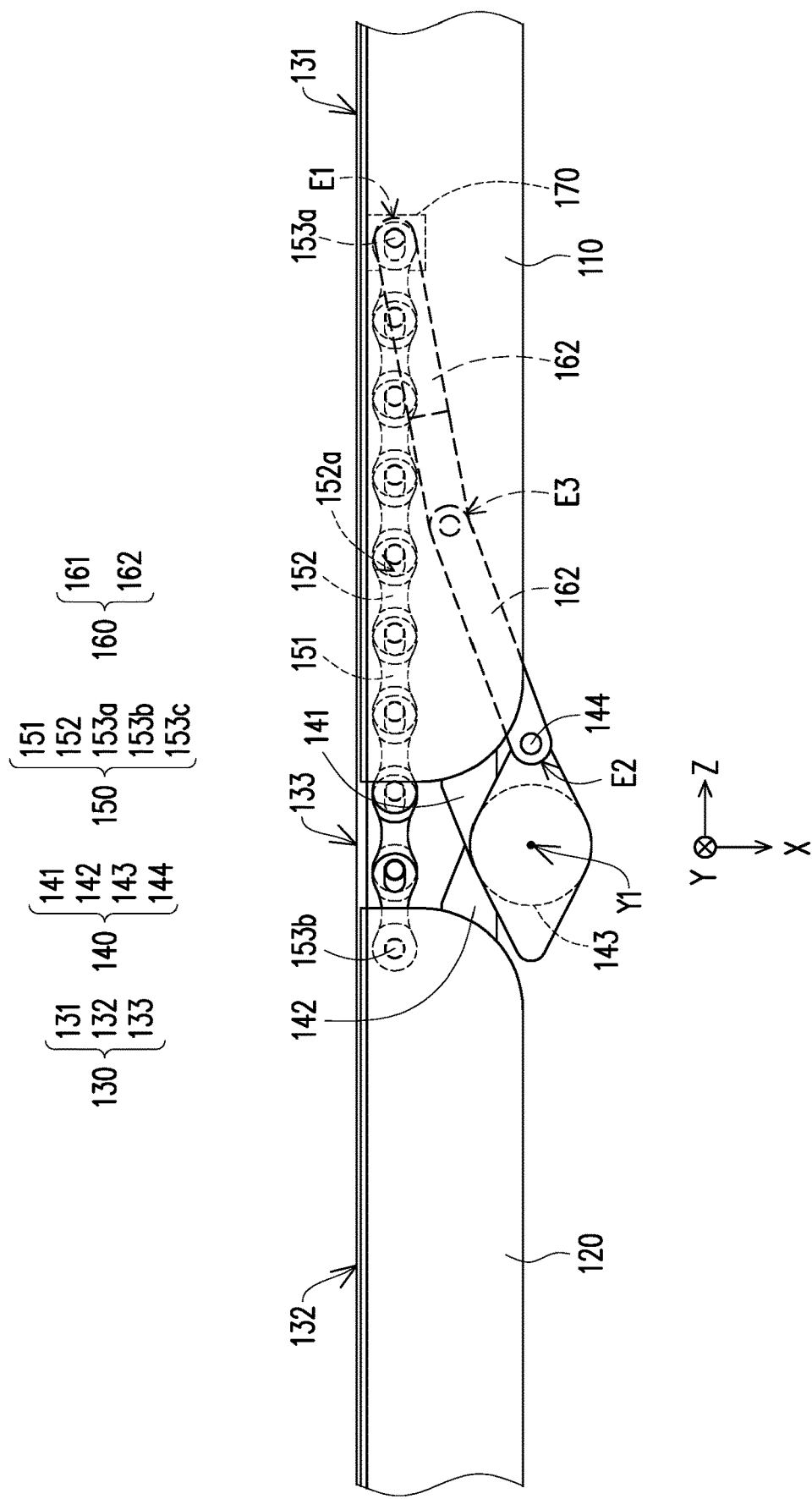
FIG. 5 is a partial enlarged diagram of the foldable electronic device of FIG. 4 in another state.

FIG. 5 is a partial enlarged diagram of the foldable electronic device of FIG. 4 in another state, and the foldable electronic device 100 is drawn in the unfolded state herein. Referring to FIG. 3 and FIG. 5, in the present embodiment, it may be clearly known here that the arc line L1 shown in FIG. 4 will be also transformed to the straight line when being transformed to the unfolded state of FIG. 5.

It is worth mentioning that based on the foregoing component setting, when the foldable electronic device 100 is rotated via the hinge assembly 140, the foldable electronic device 100 will transform between the folded state shown in FIG. 4 and the unfolded state shown in FIG. 5, then along with transformation of the linkage 160 from the bent shown in FIG. 4 to the extended shown in FIG. 5, the first end E1 and the shaft 153a of the extension chain assembly 150 will move in the first body 110, and the moving distance is the sum of the moving distance of the plurality of shafts 153a and shafts 153c at the counterbore 152a in the counterbore 152a, so as to form an extension traveling which may be generated by the extension chain assembly 150, meanwhile, such action also generates the effects of unfolding and flattening the flexible display 130 via the bonding member 170, so that the flexible display 130 presents a linear state along with the flattened of the extension chain assembly 150 in the unfolded state, at the moment, the third portion 133 of the flexible display 130 is suspended between the first body 110 and the second body 120, and leans against the linear local portion of the extension chain assembly 150. On the contrary, when the extension chain assembly 150 is transformed from the unfolded state to the folded state, the flexible display 130 may be also linked to be transformed from the flattened state to the bent state.

Thus, the foldable electronic device 100 is capable of smoothly compensating bent deformation of the flexible display 130 generated in the transforming process between the folded state and the unfolded state, that is, it is equivalent to the situation that the arc shape formed by the flexible display 130 in the folded state may be effectively eliminated when being transformed to the unfolded state. That is, in the transforming process between the folded state and the unfolded state, the movement of the shafts 153c and shaft 153a pivoted to the counterbore 152a between two opposite ends of the counterbore 152a is just used for forming the extension traveling.

To sum up, in the foregoing embodiment of the present disclosure, the foldable electronic device is matched with the linkage disposed between the hinge assembly and the bodies via the extension chain assembly connected between the two bodies, so that in the transforming process between the folded state and the unfolded state of the two bodies, a pivoted portion of the linkage and the extension chain assembly is capable of sliding in one of the two bodies, so as to drive the extension chain assembly to generate an extension state change, while the extension traveling may be used for compensation of the size difference generated in the transforming process of the flexible display, and therefore, the arc shape presented by the flexible display in the folded state may be smoothly eliminated when the flexible display is transformed to the unfolded state, so that the flexible display presents a flattened linear outline in the unfolded state, and then the situation that the flexible display is wrinkled or broken is effectively avoided, to prolong the service life of the flexible display.

Although the present invention is described with reference to the above embodiments, the embodiments are not intended to limit the present invention. A person of ordinary skill in the art may make variations and modifications without departing from the spirit and scope of the present invention. Therefore, the protection scope of the present invention should be subject to the appended claims.

What is claimed is:

1. A foldable electronic device, comprising:
a first body;
a second body;
a flexible display, disposed on the first body and the second body;
a hinge assembly, connected between the first body and the second body, the first body and the second body being rotated relatively via the hinge assembly, so as to transform between an unfolded state and a folded state;
an extension chain assembly; and
a linkage, an end of the linkage and an end of the extension chain assembly being pivoted together and coupled to the first body in a sliding and pivoting manner, another end of the linkage being pivoted to the hinge assembly, another end of the extension chain assembly being pivoted to the second body, wherein in a transforming process between the folded state and the unfolded state, an extension traveling of the extension chain assembly compensates a size difference of the flexible display generated in the transforming process between the folded state and the unfolded state, wherein in the folded state, the extension chain assembly is in an arc shape, and in the unfolded state, the extension chain assembly is flattened and presents a straight line, a rotating shaft of the hinge assembly is located at the center of circle of the arc shape.

2. The foldable electronic device according to claim 1, wherein the position of the linkage, pivoted to the hinge assembly, is eccentric from a rotating shaft of the hinge assembly.

3. The foldable electronic device according to claim 1, wherein the flexible display has a first portion, a second portion and a third portion, the first portion being disposed on the first body, the second portion being disposed on the second body, the third portion being connected between the first portion and the second portion, in the folded state, the first body being overlapped on the second body, the third portion being suspended between the first body and the second body, and the third portion leaning against an arc-shaped local portion of the extension chain assembly, and in the unfolded state, the first body and the second body moving apart from each other, the third portion being suspended between the first body and the second body, and the third portion leaning against a linear local portion of the extension chain assembly.

4. The foldable electronic device according to claim 1, wherein the hinge assembly is a gull wing type hinge, a rotating shaft of the hinge assembly being located outside the first body and the second body.

5. The foldable electronic device according to claim 1, further comprising a bonding member, the extension chain assembly being linked to the flexible display by the bonding member.

6. A foldable electronic device, comprising:
a first body;
a second body;
a flexible display, disposed on the first body and the second body;
a hinge assembly, connected between the first body and the second body, the first body and the second body being rotated relatively via the hinge assembly, so as to transform between an unfolded state and a folded state;
an extension chain assembly comprises a plurality of chains and a plurality of shafts, arranged between the first body and the second body along a line, and the shafts respectively penetrating through the chains;
a plurality of connecting members, located at two opposite sides of the chains, each of the connecting members being pivoted to two adjacent shafts, each of the connecting members having a counterbore, one of any two adjacent shafts being pivoted to the counterbore, and the shaft pivoted to the counterbore moving between two opposite ends of the counterbore to form the extension traveling in the transforming process between the folded state and the unfolded state; and
a linkage, an end of the linkage and an end of the extension chain assembly being pivoted together and coupled to the first body in a sliding and pivoting manner, another end of the linkage being pivoted to the hinge assembly, another end of the extension chain assembly being pivoted to the second body, wherein in a transforming process between the folded state and the unfolded state, an extension traveling of the extension chain assembly compensates a size difference of the flexible display generated in the transforming process between the folded state and the unfolded state.

7. A foldable electronic device, comprising:
a first body;
a second body;
a flexible display, disposed on the first body and the second body;
a hinge assembly, connected between the first body and the second body, the first body and the second body being rotated relatively via the hinge assembly, so as to transform between an unfolded state and a folded state;
an extension chain assembly; and
a linkage, an end of the linkage and an end of the extension chain assembly being pivoted together and coupled to the first body in a sliding and pivoting manner, another end of the linkage being pivoted to the hinge assembly, another end of the extension chain assembly being pivoted to the second body, wherein in a transforming process between the folded state and the unfolded state, an extension traveling of the extension chain assembly compensates a size difference of the flexible display generated in the transforming process between the folded state and the unfolded state,
wherein the linkage comprises a first connecting rod and a second connecting rod, the first connecting rod has a first end pivoted with the extension chain assembly, and the first end being movably pivoted to the first body, the second connecting rod is pivoted to a third end with the first connecting rod, the second connecting rod further having a second end to be pivoted to the hinge assembly, and the second end rotating relative to a rotating shaft of the hinge assembly.

* * * * *